(12) United States Patent
Zhang et al.

(10) Patent No.: US 12,362,293 B2
(45) Date of Patent: Jul. 15, 2025

(54) DOUBLE SEAL RING AND ELECTRICAL CONNECTION OF MULTIPLE CHIPLETS

(71) Applicant: Marvell Asia Pte Ltd, Singapore (SG)

(72) Inventors: Lijuan Zhang, Fremont, CA (US); Runzi Chang, Saratoga, CA (US)

(73) Assignee: Marvell Asia Pte Ltd, Singapore (SG)

(*) Notice: Subject to any disclaimer, the term of this patent is extended or adjusted under 35 U.S.C. 154(b) by 420 days.

(21) Appl. No.: 17/869,820

(22) Filed: Jul. 21, 2022

(65) Prior Publication Data
US 2023/0029110 A1 Jan. 26, 2023

Related U.S. Application Data

(60) Provisional application No. 63/224,297, filed on Jul. 21, 2021.

(51) Int. Cl.
| | |
|---|---|
| *H01L 23/58* | (2006.01) |
| *H01L 23/00* | (2006.01) |
| *H01L 23/31* | (2006.01) |
| *H01L 23/522* | (2006.01) |
| *H01L 25/00* | (2006.01) |
| *H01L 25/065* | (2023.01) |

(52) U.S. Cl.
CPC ........ *H01L 23/585* (2013.01); *H01L 23/3185* (2013.01); *H01L 23/5226* (2013.01); *H01L 24/16* (2013.01); *H01L 25/0655* (2013.01); *H01L 25/50* (2013.01); *H01L 2224/16225* (2013.01)

(58) Field of Classification Search
CPC ............... H01L 23/585; H01L 23/3185; H01L 23/5226; H01L 24/16; H01L 25/0655; H01L 25/50; H01L 2224/16225

USPC .......................................................... 257/668
See application file for complete search history.

(56) References Cited

U.S. PATENT DOCUMENTS

| | | | |
|---|---|---|---|
| 9,006,908 | B2 | 4/2015 | Pincu et al. |
| 9,865,503 | B2 | 1/2018 | Rotem et al. |
| 10,229,889 | B2 | 3/2019 | Tatour et al. |
| 10,622,317 | B2 | 4/2020 | Tatour et al. |
| 2010/0237472 | A1 | 9/2010 | Gillis et al. |
| 2018/0151507 | A1 | 5/2018 | Chen et al. |

(Continued)

OTHER PUBLICATIONS

VEECO, "Lithography System for the Semiconductor Industry—Ultratech AP200/300—VEECO", pp. 1-4, year 2022, as downloaded from https://www.directindustry.com/prod/veeco/product-16363-2028324.html.

(Continued)

*Primary Examiner* — Tu-Tu V Ho
(74) *Attorney, Agent, or Firm* — Meitar Patents Ltd.; Daniel Kligler (57) ABSTRACT

An electronic device includes: (i) a first chiplet including a first seal ring, which is disposed in metal layers embedded between a first surface of the first chiplet, and a first substrate of the first chiplet, (ii) a second chiplet including a second seal ring, which is disposed in metal layers embedded between a second surface of the second chiplet, and a second substrate of the second chiplet, and (iii) a third seal ring, which surrounds the first and second chiplets and is disposed in a dielectric substrate extrinsic to the metal layers and overlaying the first and second surfaces of the first and second chiplets.

20 Claims, 4 Drawing Sheets

(56) References Cited

U.S. PATENT DOCUMENTS

2018/0226331 A1    8/2018  Sarkar et al.
2022/0262695 A1*   8/2022  Chang ................ H01L 23/5389

OTHER PUBLICATIONS

Asahi Kasei Corporation, "Photosensitive Dielectric Materials—PIMEL TM", pp. 1-11, year 2022, as downloaded from https://asahi-kasei-pimel.com/en/.
International Application # PCT/IB2022/056733 Search Report dated Nov. 3, 2022.

* cited by examiner

DOUBLE SEAL RING AND ELECTRICAL CONNECTION OF MULTIPLE CHIPLETS

CROSS-REFERENCE TO RELATED APPLICATIONS

This application claims the benefit of U.S. Provisional Patent Application 63/224,297, filed Jul. 21, 2021, whose disclosure is incorporated herein by reference.

FIELD OF THE DISCLOSURE

The present invention relates generally to electronic devices, and particularly to improved methods and systems for high performance electronic devices fabricated from multiple chiplets.

BACKGROUND

Various techniques are known in the art for fabricating high performance electronic devices from multiple chips and/or chiplets, as well as fabricating devices in which seal rings are formed around different combinations of chips and/or chiplets on a silicon wafer during manufacturing Such techniques provide different options for wafer dicing in a manner that enables the production of chips having different multiples of circuitry components that can alternatively be stand-alone combined components, without having to specifically design different chips.

For example, U.S. Pat. No. 9,865,503, whose disclosure is incorporated herein by reference, describes the utilization of lower-level and upper-level masks of a mask set used during chip fabrication to form multiple modular units of circuit structures a semiconductor wafer. The method comprises utilizing different upper-level masks during integrated circuit (IC) manufacture to form in the metallic layers of an IC either embedded upper-level IC structures that couple lower-level IC, structures entirely within a single die of a semiconductor wafer, or embedded upper-level IC structures formed in the semiconductor IC that couple lower-level structures in a die and that extend across seal-ring like boundaries to couple adjacent dies.

The description above is presented as a general overview of related art in this field and should not be construed as an admission that any of the information it contains constitutes prior art against the present patent application.

SUMMARY

An embodiment that is described herein provides an electronic device including: (i) a first chiplet in a first seal ring, which is disposed in metal layers embedded between a first surface of the first chiplet, and a first substrate of the first chiplet, (ii) a second chiplet including a second seal ring, which is disposed in metal layers embedded between a second surface of the second chiplet, and a second substrate of the second chiplet, and (iii) a third seal ring, which surrounds the first and second chiplets and is disposed in a dielectric substrate extrinsic to the metal layers and overlaying the first and second surfaces of the first and second chiplets.

In some embodiments, at least a third section of the third seal ring is disposed over first and second sections of the first and second seal rings, respectively. In other embodiments, the first chiplet includes first electrical terminals disposed on the first surface, the second chiplet includes second electrical terminals disposed on the second surface, the electronic device including electrical connections which are disposed over the first and second electrical terminals and are configured to conduct electrical signals between the first and second electrical terminals. In yet other embodiments, the electronic device includes at least an electrically conductive layer and at least a section of the third seal ring and the electrical connections is implemented in the electrically-conductive layer.

In some embodiments, the electrical connections are formed in at least first and second layers of a stack of layers that are electrically connected using one or more conductive vias, the stack of layers including (a) a first dielectric layer, which is formed between: (i) the first and second surfaces, and (ii) the first layer, and having a first dielectric constant, and (b) a second dielectric layer, which is formed between the first and second layers, and having a second dielectric constant, different from the first dielectric constant. In other embodiments, the stack of layers includes the third seal ring implemented in at least the first and second layers disposed over the first and second surfaces, the first and second chiplets and the stack of layers are flipped and are disposed on a common substrate, the electronic device includes a gap between the first and second chiplets, the gap is filled with a third dielectric layer having a third dielectric constant different from the second dielectric constant, and a fourth section of the third seal ring is disposed on a surface of the first dielectric layer. In yet other embodiments, at least one of the first and second dielectric constants is smaller than the third dielectric constant.

In some embodiments, the common substrate includes an interposer or a circuit board, and including additional electrical connections, which are disposed between the common substrate and at least one of the first and second layers of the stack of layers, which are configured to conduct signals between the common substrate and at least one of the first and second layers. In other embodiments, the first and second layers include copper, the first dielectric layer includes carbon-doped silicon dioxide or photosensitive polyimide having the first dielectric constant larger than 3.2, and the second dielectric layer includes porous $CH_3$-doped silicon dioxide or polybenzoxazoles (PBO), and the second dielectric constant is smaller than 2.7. In yet other embodiments, the third seal ring encloses an area larger than 858 square millimeters.

There is additionally provided, in accordance with an embodiment of the present invention, a method for producing an electronic device, the method including disposing, on a common substrate, a first chiplet including a first seal ring formed in meta lavers of the first chiplet, the first seal ring being disposed between a first surface of the first chiplet, and a first substrate of the first chiplet. A second chiplet that includes a second seal ring formed in metal layers of the second chiplet, the second seal ring being disposed on the common substrate, between a second surface of the second chiplet, and a second substrate of the second chiplet A dielectric substrate, extrinsic to the metal layers, is disposed to overlay the first and second surfaces of the first and second chiplets, and a third seal ring to surround the first and second chiplets is formed in the dielectric substrate.

The Present disclosure will be more fully understood from the following detailed description of embodiments thereof, taken together with the drawings in which:

DETAILED DESCRIPTION OF EMBODIMENTS

Electronic devices, such as network switches, may comprise multiple chips (or chiplets) connected together in a package. The chips are typically formed as dies on a semiconductor (e.g., silicon) substrate, and subsequently, are diced off (using one or more mechanical and/or laser sawing processes), separated from one another, and packaged to form the respective chips.

In some cases, the sawing process may introduce into the chip one or more of: (i) a mechanical stress, resulting in defects such as microcracks in the substrate and/or in layers of the chip, and (ii) debris, which is a byproduct of the sawing and may contaminate the chip, and therefore, may result in undesired electrical shorts between electrical traces of the chip.

Embodiments of the present disclosure that are described herein, provide techniques for improving the production yield by reducing defects, such as the microcracks and contamination described above, and electronic devices fabricated using such techniques. Moreover, the disclosed techniques may be applied for improving inter-chiplet electrical connections within an electronic device comprising multiple chiplets connected to one another.

In some embodiments, the electronic device comprises at least two chiplets, referred to herein as first and second chiplets, which are connected to one another as will be described hereinafter. The first chiplet comprises a first seal ring, which surrounds the area of the first chiplet and is disposed between a first surface (e.g., an outer surface) and a first substrate of the first chiplet.

The second chiplet comprises a second seal ring, which surrounds the area of the second chiplet and is disposed between a second surface (e.g., an outer surface) and a second substrate of the second chiplet.

In some embodiments, the formation of the first and second seal rings is integrated in the fabrication process of the first and second chiplets, and a section of the first and second chiplets is embedded into the bulk of the first and second substrates, respectively, so as to prevent or reduce the formation of the aforementioned microcracks.

In some embodiments, the electronic device comprises a third seal ring, which surrounds the first and second chiplets and is disposed over the first and second surfaces of the first and second chiplets, respectively. Note that the third seal ring is formed after the first and second chiplets have been fabricated, and at least a section of the third seal ring is disposed over respective sections of the first and second seal rings, as described in detail in FIGS. 1-4 below.

In some embodiments, the first chiplet comprises first electrical terminals disposed on the first surface, and the second chiplet comprises second electrical terminals disposed on the second surface. The electronic device further comprises electrical connections which are disposed over the first and second electrical terminals and are configured to conduct electrical signals between the first and second chiplets.

In some embodiments, the electrical connections may comprise multiple levels of electrical traces for increasing the bandwidth and routing on of signals conducted between the first and second chiplets, as described in detail in FIG. 2 below.

In some embodiments, the electrical connections may be formed together with the third seal ring at the same time, and are implemented in the same layers using a fabrication process described in detail in FIGS. 5 and 6 below.

The description above is presented as a general overview of embodiments of the present disclosure, which are described in detail herein.

Figures 1, 2:
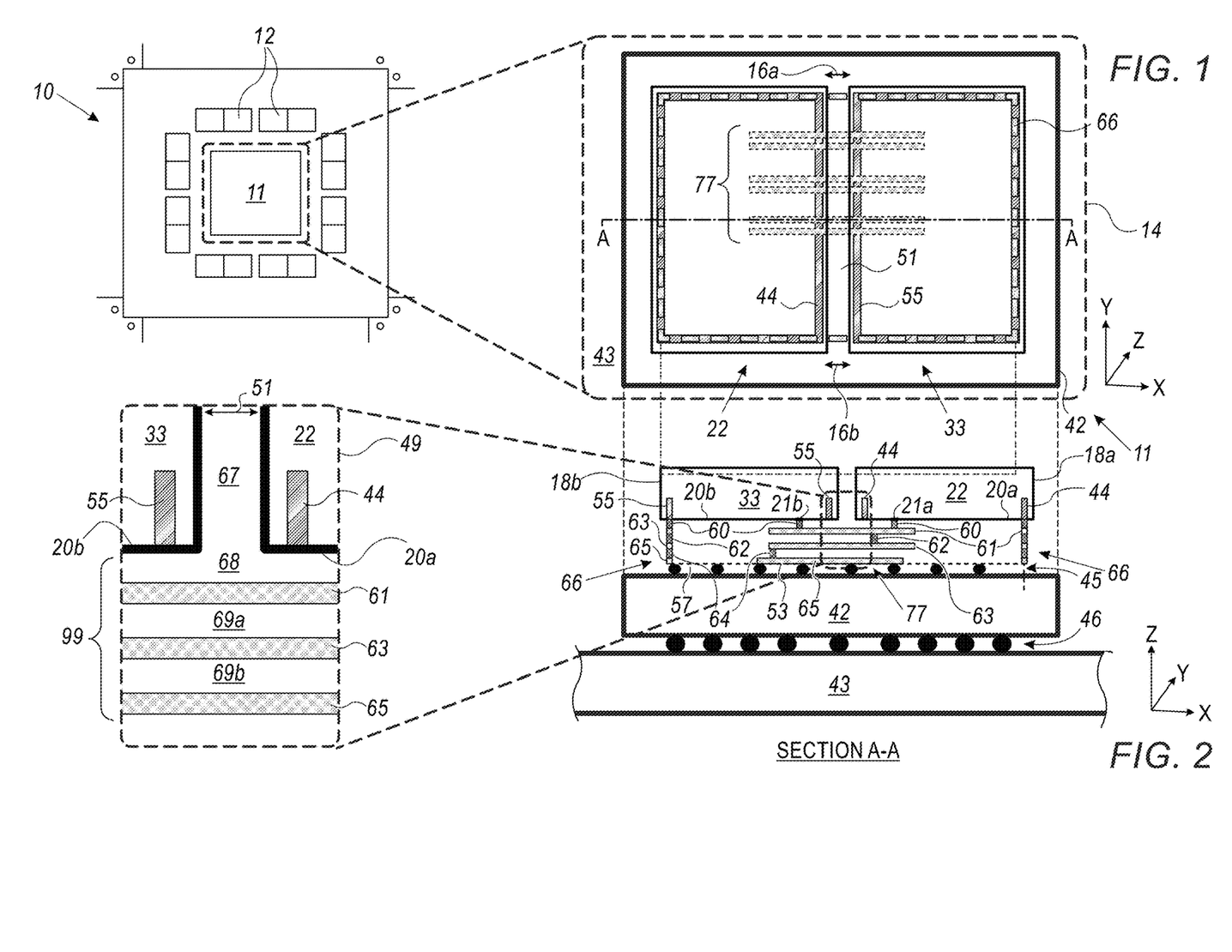
FIG. 1 is a schematic, pictorial illustration of an electronic device, in accordance with an embodiment that is described herein.
FIG. 2 is a schematic, sectional view of the electronic device of FIG. 1, in accordance with an embodiment that is described herein.

FIG. 1 is a schematic, pictorial illustration of an electronic device 11 of an electronic assembly 10, in accordance with an embodiment that is described herein.

In some embodiments, electronic assembly 10 comprises a network switching assembly comprising a switch, referred to herein as electronic device 11, and multiple devices 12, such as peripheral chips surrounding electronic device 11 and configured to exchange signals therewith.

Reference is now made to an inset 14 showing a top view of the structure of electronic device 11.

In some embodiments, electronic device 11 comprises chiplets 22 and 33, which are electrically connected using electrical connections (ECs) 77 formed between (i) chiplets 22 and 33 and (ii) an interposer 42 described in detail below. Note that ECs 77 are hidden in the top view by other components of electrical device 11, and therefore, are shown in dashed lines.

In some embodiments, ECs 77 are configured to conduct electrical signals between chiplets 22 and 33 and also between chiplets 22 and 33 and interposer 42, and an example configuration of ECs 77 is shown in detail in FIG. 2 below, which is a sectional view AA of inset 14.

In the context of the present disclosure and in the claims, the term chiplet refers to an integrated circuit (IC), which is formed by partitioning a semiconductor-based die, and contains a well-defined subset of functionality. For example, a chiplet may be used as a Serialize/deserialize (SerDes) of a network switch, as an additional processor core, or in any other suitable application. A given chiplet may be integrated with one or more additional chiplets, which may be formed using the same technology node or a different technology node, and may have any suitable design and functionality. Moreover, the same chiplet can be used different devices for reusing the same intellectual property in several electronic products. Furthermore, by integrating known good dies of multiple chiplets, as shown for example, in FIGS. 1-4 of the present disclosure, the production yield for that of a multi-chiplet device is typically higher than that of monolithic a system-on-chip (SoC) device formed on a single die, because one or more non-functional or faulty modules of the SoC may result in non-functionality of the entire SoC device.

In some embodiments, chiplet 22 comprises a seal ring (SR) 44, which surrounds most or all of the area of chiplet 22. Similarly, chiplet 33 comprises a SR 55, which surrounds most or all of the area of chiplet 33. In various embodiments, seal rings 44 and 55 are fabricated in metal of chiplets 22 and 33, respectively.

In some embodiments, electronic device 11 comprises a global serial ring, also referred to herein as a SR 66, which is disposed over the surface of, and surrounds the areas of chiplets 22 and 33. In other words, global seal ring is extrinsic to the metal layers of chiplets 22 and 33, but rather is formed in a non-silicon dielectric structure that is fabricated to overlay chiplets 22 and 33. In the present example, SR 66 is disposed over respective sections of SRs 44 and 55. Note that, global SR 66 is hidden in the top view by chiplets 22 and 33, as will be shown in a sectional view of FIG. 2 below. Moreover, sections 16a and 16b of SR 66, which are traversing underneath a gap 51 between chiplets 22 and 33, are not formed over SRs 44 and 55 but are formed underneath a filling layer (shown in FIG. 2 below) that fills gap 51 between chiplets 22 and 33.

In the present example, gap 51 is formed in the scribe line of the silicon wafer. The scribe line may be formed during the production and the dicing/sawing processes of chiplets 22 and 33.

In other embodiments, electronic device 11 may not have a gap between chiplets 22 and 33, and may have any suitable structure having suitable layers, such as but not limited to dielectric and/or metal (e.g., copper) layers note that in the present example, chiplets 22 and 33 are flipped before being disposed over interposer 42, and therefore, the present implementation does not require the placement process of chiplets 22 and 33 before the formation of the redistributed layer (RDL) and the seal ring described below.

In some embodiments, electronic device 11 is mounted on a substrate of electronic assembly 10, in the present example, interposer 42 made from a silicon wafer (or any other suitable materials), which is mounted on an organic substrate of electronic assembly 10, such as a circuit board (CR) 43. Note that interposer 42 is the configuration of electronic device 11, and in other embodiments, the package of electronic device 11 may not have an interposer, and chips or chiplets (e.g., chiplets 22 and 33) of electronic device 11 may be mounted directly on a substrate of the package.

In other embodiments, electronic assembly 10 comprises any other suitable substrate and/or interposer, such as but not limited to an organic interposer, and one or more chiplets (e.g., chiplets 22 and 33) mounted thereon.

FIG. 2 is a schematic, sectional view of electronic device 11, in accordance with an embodiment that is described herein.

In some embodiments, chiplets 22 and 33 are formed on substrates 18a and 18b, respectively. In the present example, both substrates 18a and 18b comprise a semiconductor substrate, such as a single-crystal silicon wafer used in very large-scale integration (VLSI) processes for producing ICs.

In some embodiments, SR 44 is formed between the bulk of substrate 18a and an outer surface 20a of chiplet 22. Similarly, SR 55 is formed between the bulk of substrate 18b and an outer surface 20b of chiplet 33. Note that SRs 44 and 55 are configured to reduce defects in chiplets 22 and 33, respectively, by blocking undesired mechanical stress and debris (formed during the sawing process of the chiplets) described above, from being introduced into and/or over chiplets 22 and 33.

In an embodiment, one or more sections of SRs 44 and 55 may hatch over (i.e., extended over) surfaces 20a and 20b, respectively. In this embodiment, the hatched sections may buffer between the scribe line (not shown) intended to be sawed between adjacent chiplets, and surfaces 20a and 20b, so as to prevent transfer of the debris onto surfaces 20a and 20b.

In some embodiments, SRs 44 and 55 are typically integrated into the production process of chiplets 22 and 33, respectively. In an embodiment, SR 66 is produced using a separate process carried out during the integration of electronic device 11, as will be described in detail in FIGS. 5 and 6 below. Note that in principle, it is possible to form global SR 66 in the same level as SRs 44 and 55. For example, SRs 44 and 55 may be smaller and formed into the center of chiplets 22 and 33, respectively, and SR 66 may be formed at the original position of SRs 44 and 55. This configuration, however, has two drawbacks: (i) it requires a separate formation of sections 16a and 16b of SR 66, and (ii) it reduces the effective area of chiplets 22 and 33, and therefore increases the cost and/or reduces the functionality of one or both of chiplets 22 and 33.

In some embodiments, chiplet 22 comprises one or more electrical terminals 21a disposed on surface 20a, and chiplet 33 comprises one or more electrical terminals 21b disposed on surface 20b. In the present example, electrical terminals 21a and 21b comprise pads made from aluminum or any other suitable conductive layer.

In some embodiments, ECs 77 are disposed to overlay surfaces 20a and 20b, and in the present example, over electrical terminals 21a and 21b. ECs 77 are configured to conduct electrical signals between chiplets 22 and 33.

In some embodiments, ECs 77 comprise multiple levels of electrical traces for increasing the bandwidth and routing options of signals conducted between terminals 21a and 21b of chiplets 22 and 33, respectively. In the example of FIG. 2, ECs 77 comprise electrically conductive layers, also referred to herein as electrically conductive traces 61, 63 and 65, and electrically conductive vias 60, 62 and 64. Electronic device 11 further comprises one or more dielectric layers disposed between traces 61, 63 and 65, and vias 60, 62 and 64, and are used for mechanical support and for electrically isolating between the electrically conductive layers. The dielectric layers are described in detail below. All the traces and vias of ECs 77 comprise suitable metal layers, such as but not limited to aluminum, copper, or alloys thereof. In some embodiments, vias 60 are connecting between terminals 21a and 21b and traces 61, which are the first level trace of ECs 77. Similarly, one or more via(s) 62 are connecting between traces 61 and 63, and one or more via (s) 64 are connecting between traces 63 and 65.

In some embodiments, the layers (e.g., vias and traces 60-65) of ECs 77 may be formed together with SR 66 at the same time using a fabrication process, which is described in detail in FIGS. 5 and 6 below, or using any other suitable process flow. Note that the position of vias 60, 62 and 64 and traces 61, 63 and 65 must by aligned along a Z-axis of the XYZ coordinate system of electronic device 11. For example, in case the size of vies 62 and 64 in Y-axis is about 1 μm (e.g., between about 0.5 μm and 2 μm), the misalignment between via 62 and trace 63, and between race 63 and via 64 are about 0.1 μm or any other misalignment representing about 10% of the size of the respective vies. In the context of the present disclosure and in the claims, the terms "about" or "approximately" for any numerical values or ranges indicate a suitable dimensional tolerance that allows the part or collection of components to function for its intended purpose as described above.

Reference is now made to an inset 49. In some embodiments, cap 51 is filled with a solid dielectric layer 67, in the present example, a carbon-doped silicon dioxide ($SiO_2$) having a dielectric constant (K) value between about 3.2 and 3.7 formed using a plasma-enhanced chemical vapor deposition (PECVD) process, or using any other suitable process for depositing a dielectric layer between chiplets 22 and 33. In an embodiment, layer 67 is configured to fill gap 51 between chiplets 22 and 33. Note that in such embodiments, in gap 51, SR 66 is formed over layer 67, and is further formed over surfaces 20a and 20b.

In some embodiments, dielectric layers 68, 69a and 69b are formed between the vias and traces of ECs 77. More specifically, in the example of inset 49, layer 68 is formed between (i) trace 61 and surfaces 20a and 20b and the upper surface of layer 67 formed between surfaces 20a and 20b. Similarly, layer 69a is formed between traces 61 and 63, and layer 69b is formed between traces 63 and 65. In some embodiments, layer 69b has a dielectric constant (K) between about 2.4 and 2.7. In the present example, layer 69b comprises porous $SiO_2$ doped with a methyl group containing one carbon atom bonded to three hydrogen atoms ($CH_3$), also referred to herein as porous $CH_3$-doped $SiO_2$. In some embodiments, layer 69a may comprise porous $CH_3$-doped $SiO_2$, or any other suitable material having K value smaller than about 3, and layer 68 may comprise carbon-doped $SiO_2$, or any other suitable material having K value smaller than about 3.7. Additionally, or alternatively, at least one of layers 67, 68, 69a and 69b is made from any suitable polymer having the dielectric constants described above for each of these layers.

In alternative configurations, two or more chiplets that are mounted on a common substrate, may be electrically connected using traces formed within the substrate (e.g., a silicon interposer, or any other suitable interposer such as but not limited to an organic substrate). Such connections are described, for example, in U.S. Pat. No. 9,006,908 to Pincu et al., whose disclosure is incorporated herein by reference. Note that a silicon interposer has a dielectric constant of about 12, thus, using in layers 67, 68, 69a and 69b, materials having dielectric constants lower than that of silicon, typically reduce power consumption of electronic device 11, and also simplify the production process compared to that of electrical connections formed in an interposer, as will be described in FIGS. 5 and 6 below. In the present example, low-k materials are used in layer 67, and ultra-low-k materials are used in layers 69a and 69b for improving the electrical performance of electronic device 11. Moreover, ECs 77 do not require bumps, such as bumps 45, for connecting between terminals 21a and 21b of chiplets 22 and 33, respectively. This configuration allows the use of tighter pitch in ECs 77 compared to that of interposer 42 or any other type of substrate, as described above.

In some embodiments, the buildup or stack of dielectric and conductive layers formed between. (i) surfaces 20a and 20b, and (ii) bump, 45, are referred to herein as stack 99. More specifically, stack 99 comprises the layers of vias 60, 62 and 64, the layers of traces 61, 63 and 65, and dielectric layers 68, 69a and 69b. Note that in an embodiment the layers are extrinsic to chiplets 22 and 33 and are built up in an overlay manner with SR 66, vias 60, 62 and 64, traces 61, 63 and 65 of ECs 77 being formed by suitable patterning of the layers of stack 99. For example, in the formation of SR 66, dielectric layers 68, 69a and 69b are etched away, and in SR 66, stack 99 comprises the layers of vias 60, 62 and 64, the layers of traces 61, 63 and 65. In the formation of ECs 77, all the layers of vias 60, 62 and 64, traces 61, 63 and 65, and dielectric layers 68, 69a and 69b are arranged for generating electrical connections between chiplets 22 and 33 and interposer 42 (or any other substrate in case interposer is removed from the configuration of electronic device 11).

Reference is now made back to the general view of FIG. 2. In some embodiments, electronic assembly 10 comprises bumps 45 formed on/between the buildup of layers of stack 99 (shown in FIG. 2, and in inset 49) and interposer 42 are configured to conduct electrical signals therebetween. More specifically, bumps 45 are configured to conduct electrical signals between interposer 42 and pads (not shown) connected to or formed on a surface 53 of layer 65. As shown in the sectional view of FIG. 2, some of bumps 45 are placed in contact with dielectric layer 69b. These bumps may be electrically coupled to layer 65 by forming electrically conductive traces RDL or any other suitable connection (not shown) between layer 69b and these bumps 45. Note that the RDL traces may be formed on or within surface 53 and a surface 57 of layer 69b shown by the dashed line.

In some embodiments, at least some of the layers of traces 61, 63 and 65 and the layers of vias 60, 62 and 64, may be formed by deposition, followed by patterning (e.g., etching), and subsequently, deposition and planarization of the respective dielectric layers (e.g., layers 68, 69a and 69b). For example, after the deposition and planarization of layer 68, layer 61 is disposed and patterned on the outer surface of layer 68, and subsequently, dielectric layer 69a is deposited and planarized over the outed surfaces of lavers 61 and 68. This technique is also referred to herein as a metal-etch based patterning technique.

In other embodiments, at least some of the layers of traces 61, 63 and 65 and the layers of vias 60, 62 and 64, may be formed by forming a trench and/or a hole in the respective dielectric layer, and subsequently, the respective trace and/or via is formed within the trench and/or hole of the respective dielectric layer. For example, after the formation of dielectric layer 69a, a hole and a trench are formed, and subsequently, the hole and the trench are filled by metal layers for producing via 62 and trace 63, respectively. This technique is also referred to herein as a dielectric-etch based patterning technique.

In alternative embodiments, at least one of the vias and traces of ECs 77 may be formed using the metal-etch based patterning technique, and at least one of the vias and traces of ECs 77 may be formed using the dielectric-etch based patterning technique.

In yet other embodiments, at least one of the vias and traces of ECs 77 may be formed using any other suitable deposition and patterning techniques.

In some embodiments, electronic assembly 10 comprises balls 46 of a ball-grid array, which are formed between interposer 42 and CE 43, and are configured to conduct electrical signals therebetween. Note that interposer 42 may have additional structures, such as through-silicon vias (TSVs—not shown), and the typical size of bumps 45 and the TSVs (e.g., along the X-axis of the XYZ coordinate system) are typically larger than that of the features of ECs 77. For example, via 60 may have a width of about 0.5 µm in X-axis, and bump 45 may have a width between about 1 µm and 5 µm, in X-axis. In other words, the pitch size (i.e., width of the line and space between adjacent lines) of ECs 77 is substantially tighter than that of interposer 42 and bumps 45. For example, the pitch size of bumps 45 is at least four times larger than the pitch size that can be obtained in via 60.

In other embodiments, interposer 42 may be removed from the configuration of the packaged electronic device, and instead, two or more chips or chiplets may be disposed directly on a circuit board (e.g., CB 43) or on any other suitable substrate used in a package of the chips or chiplets.

In yet other embodiments, instead of using a silicon-based interposer, the electronic device may comprise a suitable type of a polymer-based substrate and/or a polymer-based process. In such embodiments, the structures (e.g., vias and bumps) of the electronic device may have different dimensions. For example, in a process to form a copper RDL over a polymer substrate, the size (e.g., diameter) of via 60 may be between about 8 µm and 14 µm. Moreover, in case interposer 42 comprises silicon-based (or organic-based) interposer, the size (e.g., width in the XY plane) of bump 45 may be about 20 µm, and in case of an organic substrate the size (e.g., width in the XY plane) of bump 45 may be between about 50 µm and 80 µm.

In some embodiments, dielectric layers 67, 68, 69a and 69b are formed in the XY plane enclosed SR 66 (e.g., between the lines of SR 66 shown in the sectional view of FIG. 2). In some embodiments, layer 69b has a trench and trace 65 is formed within the trench of layer 69b, such that a surface 53 of trace 65 is approximately flush with surface 57 (shown in a dashed line) or layer 69b. In other embodiments, trace 65 may be formed using a metal patterning process, as described above.

Reference is now made back to FIG. 1. In typical VLSI processes, when producing an monolithic electronic device from a single die (rather than from multiple chips and/or chiplets, such as chiplets 22 and 33 of electronic device 11), the area of the electronic device is limited by the field size of an optical photolithography system, such as systems produced by ASMI Holding (Veldhoven, Netherlands), Nikon Group (Minato-ku, Tokyo), and Canon Inc. (Ohta-ku, Tokyo, Japan). For example, the field size may be about 33 mm by about 26 mm in XY plane, resulting in an area of about 858 mm². In the present example, electronic device 11 comprises chiplets 22 and 33 whose combined area may exceed the aforementioned 858 mm², in some implementations. In such cases, the area enclosed by SR 66 may also exceed 858 mm² and/or may exceed the sic of about 26 mm in one axis and about 33 mm in another axis (e.g. X- and Y-axes), and therefore, cannot be produced using an optical photolithography process carried out in a wafer fabrication facility (also referred to herein as a wafer fab). In some embodiments, the SR. 66 may comprise one or more redistributed layers (RDLs), produced using other suitable patterning techniques, such as but not limited to contact printing processes having a field size of about 26 mm by 68 mm or about 54 mm by 33 mm, or any other suitable technique that can be used for printing SR 66 having an area larger than about 858 mm², and/or a field size having a combination of axes larger than the aforementioned 26 mm by 33 mm. The contact printing processes may be carried out, for example, using a AP-200/300 system provided by Ultratech/Veeco (San Jose, CA). Additionally, or alternatively, SR 66 may be produced using any other suitable technique, such as maskless patterning, e.g., direct writing.

The configuration of electronic device 11 shown in FIGS. 1 and 2, is provided by way of example, in order to illustrate certain problems that are addressed by embodiments of the present disclosure and to demonstrate the application of these embodiments in enhancing the performance of such an electronic device. Embodiments of the present disclosure, however, are by no means limited to this specific sort of example electronic device, seal rings and electrical connections, and the principles described herein may similarly be applied to other sorts of and configurations of electronic devices shown, for example, in FIGS. 3 and 4 below. In alternative embodiments, at least one of interposer 42 and CB 43 may be excluded from the configuration of electronic device 11. For example, instead of producing interposer 42 and bumps 45, pads (e.g., similar to terminals 21a and 21b) may be formed over surface 53 of trace 65, and electronic device 11 may be flipped so that balls 46 are placed in contact with the pads. In this configuration, ECs 77 are used for connecting between chiplets 22 and 33, and also to connect between (i) one or both of chiplets 22 and 33, and (ii) CB 43.

Figure 3:
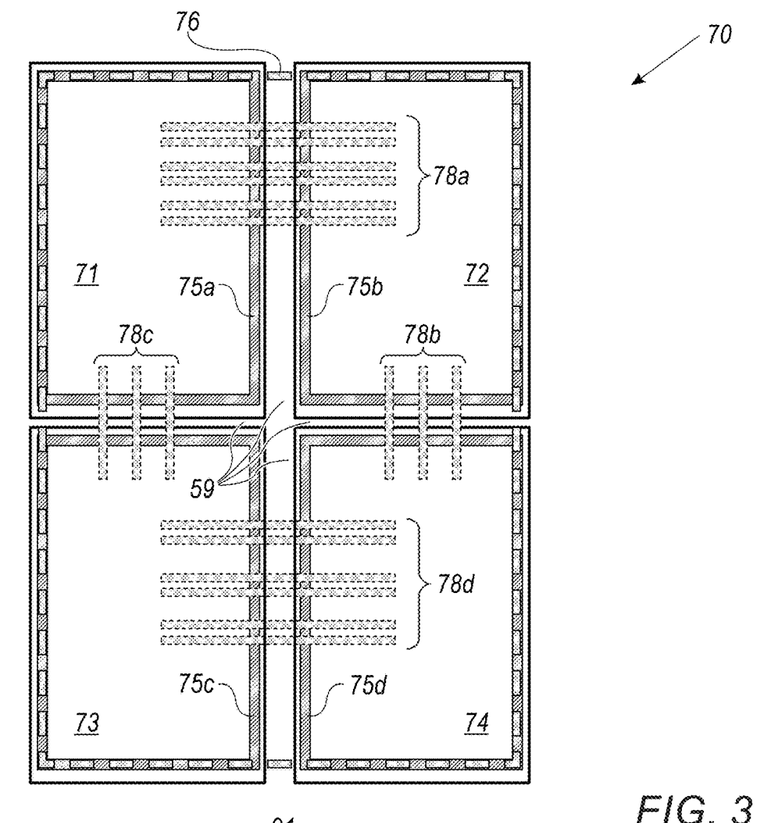
FIGS. 3 and 4 are schematic, top views of respective electronic devices, in accordance with other embodiments that are described herein.
Figure 4:
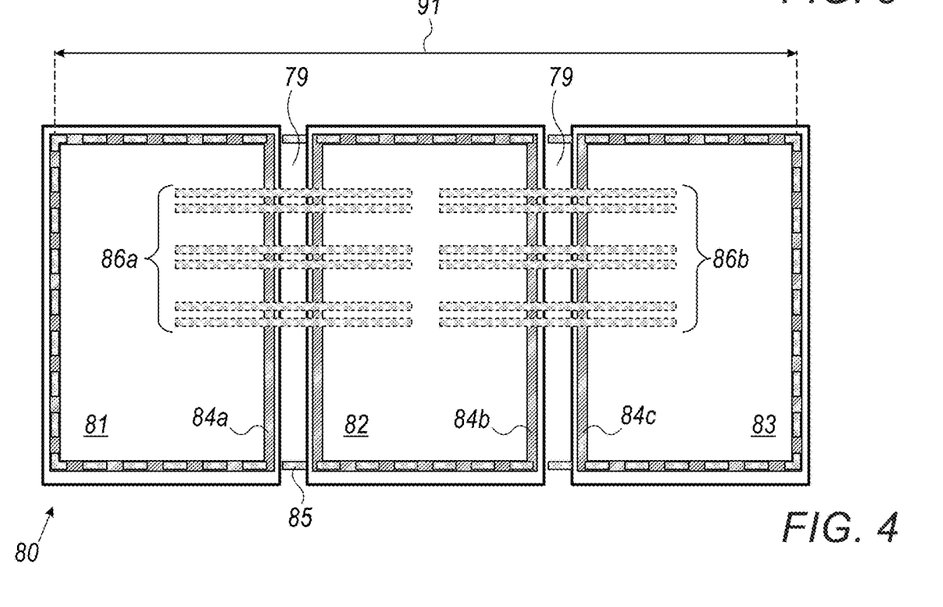

FIGS. 3 and 4 are schematic, top views of electronic devices 70 and 80, in accordance with other embodiments that are described herein. Each of electronic devices 70 and 80 may replace, for example, electronic device 11 in electronic assembly 10 of FIG. 1 above. Note that in order to focus the description on the seal rings and electrical connections that are described hereinafter, interposer 42 and CB 43 are removed from the configuration of electronic devices 70 and 80, for the sake of conceptual clarity, and may be added in FIGS. 3 and 4, based on the embodiments described in FIGS. 1 and 2 above.

Reference is now made to FIG. 3. In some embodiments, electronic device 70 comprises four chiplets 71, 72, 73 and 74 that are integrated together using the techniques described in FIGS. 1 and 2 above.

In some embodiments, chiplet 71 comprises a SR 75a surrounding most or all the area of chiplet 71, as described, for example in FIG. 1 above, for SR 44 of chiplet 22. Similarly, chiplet 72 comprises a SR 75B, chiplet 73 comprises a SR 75c and chiplet 74 comprise a SR 75d.

In some embodiments, electronic device 70 comprises ECs 78a, 78b, 78c and 78d, each of which may comprise a stack of electrical traces, vias, and dielectric layers. In an embodiment, these layers may be similar to the layers of stack 99 shown in FIG. 2 above, stack 99 comprising the traces and vias of ECs 77 shown in inset 49. In other embodiments, at least some of these layers may have any other suitable configuration. Note that ECs 78a, 78b, 78c and 78d are formed using the techniques described in FIG. 2 above for producing stack 99. moreover, (i) ECs 78a are configured to conduct electrical signals between chiplets 71 and 72, (ii) ECs 78b are configured to conduct electrical signals between chiplets 72 and 74, (iii) ECs 78c are configured to conduct electrical signals between chiplets 71 and 73, and (iv) ECs 78d are configured to conduct electrical signals between chiplets 73 and 74.

In some embodiments, electronic device 70 comprises a SR 76, which is formed together with ECs 78a, 78b, 78c and 78d using the techniques described in FIG. 2 above. SR 76 surrounds the area covered by chiplets 71-74 and is disposed over the outer surfaces of chiplets 71-74, using the same techniques described in FIG. 2 above. Note that one or more dielectric layers, such as layer 67 (shown and described in detail in FIG. 2 above), are formed for filling gaps 59 between two or more of chiplets 71-74. As shown in the sectional view of FIG. 2 above, the layers of ECs 78a-78d and SR 76 are hid den in the top view, e.g., by the chiplets (e.g., chiplets 71-74) disposed over the stack. This may be illustrated using the example of FIG. 2 above, in which chiplets 22 and 33 are disposed over stack 99, and hiding stack 99 in a top view of device 11.

Note that in U.S. Pat. No. 9,865,503 described in the background section above, in order to combine two adjacent dies, such as it was necessary to breach the internal seal ring structure. In the present disclosure, however, SR 76 that surrounds chiplets 71-74 is formed over SRs 75a-75d of chiplets 71-74, respectively, and is used to be positioned over a complete internal seal ring.

In some embodiments, SR 76 disposed over respective sections of SRs 75a-75d and over the surface of the filling dielectric layer (e.g., layer 67 of FIG. 2 above), as described for sections 16a and 16b shown in FIG. 1 above. Note that the terms "formed over" refer to the process for producing the stack of layers (e.g., stack 99 of FIG. 2 above) over the SRs of chiplets 71-74, and after concluding the formation of the stack, the chiplets and the stack are flipped (as shown in the sectional view of FIG. 2). Thus, in the example of FIG. 3 the stack comprising SR 76 and ECs 78a-78d is actually beneath chiplets 71-74 and SRs 75a-75d The same terminology is applicable for the corresponding stacks of ECs and SRs and the SRs of each chiplets as described in FIG. 2 above and in FIG. 4 below.

Note that in this configuration, the area surrounded by SR 76 may be larger than the field size of an optical photolithography system used in the wafer fab (e.g., larger than about 858 mm$^2$).

Reference is now made to FIG. 4. In some embodiments, electronic device 80 comprises three chiplets 81, 82, and 83 that are integrated together using the techniques described in FIGS. 1 and 2 above.

In some embodiments, chiplet 81 comprises a SR 84a surrounding most or all the area of chiplet 81, as described, for example, in FIG. 1 above, for SR 44 of chiplet 22. Similarly, chiplet 82 comprises a SR 84b, and chiplet 83 comprises a SR 84c.

In some embodiments, electronic device 80 comprises: (i) ECs 86a formed between chiplets 81 and 82, and (ii) ECs 86b formed between chiplets 82 and 83. ECs 86a and 86b are configured to conduct electrical signals between the respective chiplets, and have a suitable structure, such as but not limited to the structure of ECs 77 described in FIG. 2 above.

In some embodiments, electronic device 80 comprises a SR 85, which surrounds the area covered by chiplets 81-83 and is disposed over the surfaces of chiplets 81-83 and over an outer surface of one or more dielectric layer formed for filling gaps 79 between each pair of chiplets 81-83.

In some embodiments, electronic device 80 comprises a stack of layers (e.g., similar to stack 99 od FIG. 2 above), which is patterned for producing ECs 86a and 86b, and SR 85.

Note than in this configuration, the size of a section 91 of SR 85 may be larger than about 33 mm, which is the maximal size of the field of an optical photolithography system used in the wafer fab. In some embodiments, in case the size of section 91 is smaller than about 68 mm, SR 85 may be patterned using a contact printing process having a field size of about 26 mm by 68 mm. In such embodiments, SR 85 may be produced using a single mask, which reduces the odds of having discontinuity in SR 85, and reduces the cost of producing SR 85.

In some embodiments, ECs 86a and 86b are produced at the same time with SR 85 by patterning the layers of ECs 86a and 86b and SR 85 using the same patterning process operation, as described in FIG. 2 above, and will be described in further detail in FIGS. 5 and 6 below.

Figure 5:
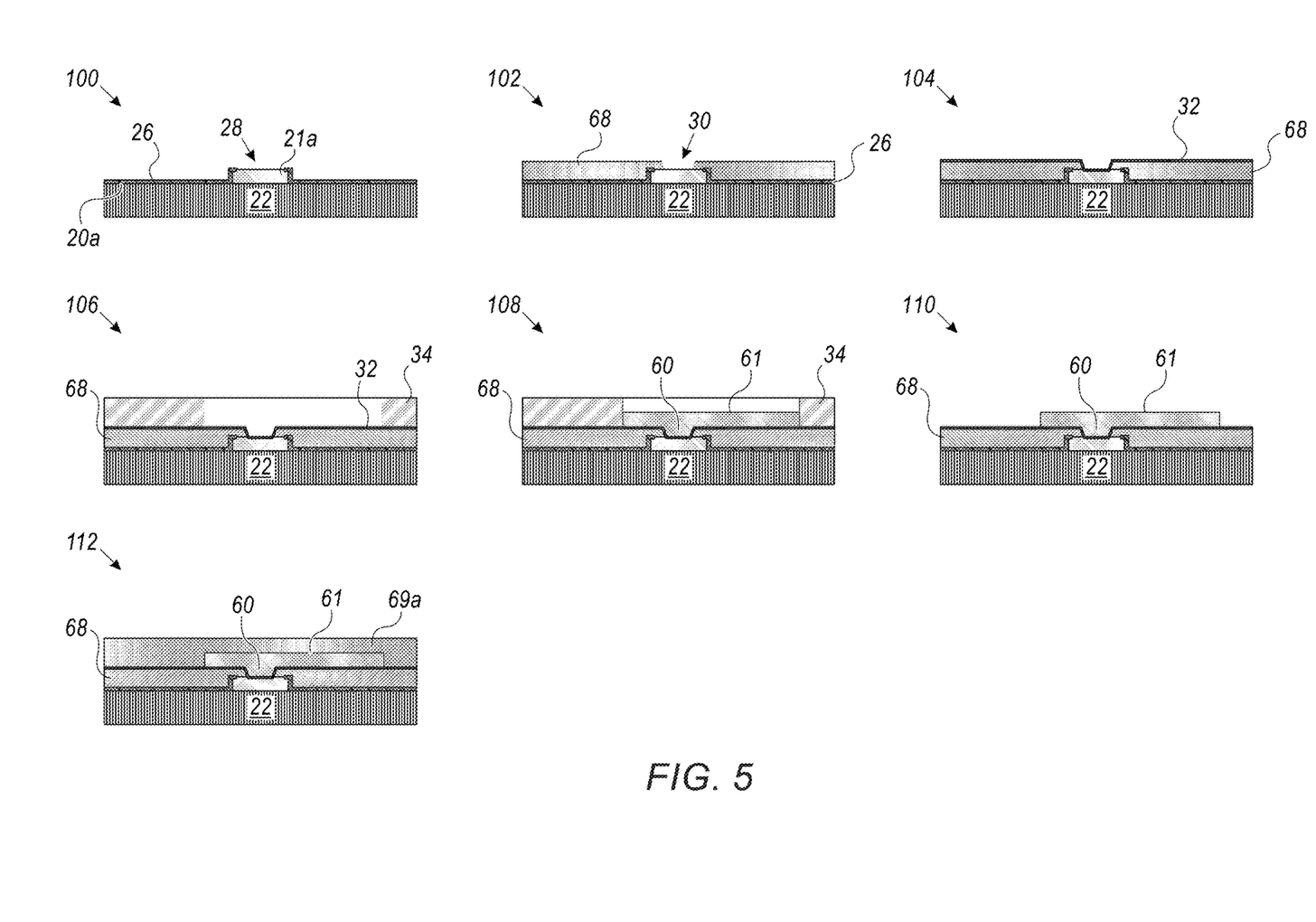
FIG. 5 is a diagram that schematically illustrates a method for producing a seal ring and electrical connections of the electronic device of FIGS. 1 and 2, in accordance with an embodiment that is described herein.

FIG. 5 is a diagram that schematically illustrates a method for producing layers 68, 60, 61 and 69a of SR 66 and ECs 77 of electronic device 11, in accordance with an embodiment that is described herein. As described in FIG. 2 above, SR 66 and ECs if are implemented using the same layers of stack 99, and for the sake of presentation clarity the operations of the method show a sectional view of the process for producing dielectric layers 68 and 69a, patterning of layer 68 and the formation of via 60 and trace 61. In some embodiments, some process operations of the method are repeated for producing vias 62 and 64, traces 63 and 65, and dielectric layer 69b of SR 66 and ECs 77, as will be described in detail herein.

In some embodiment, the method may comprise deposition of additional layers, such as layer 67 into gap 51 (not shown in FIG. 5, but shown in inset 49 of FIG. 2 above), and removal of residues of layer 67 from surfaces 20a and 20b of chiplets 22 and 33, respectively. In some embodiments, the deposition of layer 67 may be carried out using: (i) any suitable type of chemical vapor deposition (CVD) process, e.g., for depositing a carbon-doped $SiO_2$ layer, or (ii) any suitable type of polymer deposition (e.g., dispensing and spinning) processes, for producing a polymer-based dielectric layer 67.

In some embodiments, at an operation 100, terminal 21a is formed over surface 20a In the present example, terminal 21a comprises an aluminum pad, which is deposited over surface 20a (e.g., using a suitable sputtering or plating process), and is patterned using any suitable photolithography and etching techniques. Subsequently, a passivation layer 26, which is made from silicon dioxide or silicon nitride, is formed over surface 20a and over the outer surface of terminal 21a, e.g., using a chemical vapor deposition (CVD) process, and subsequently, an opening 28 is patterned in passivation layer 26, using any suitable photolithography and etching techniques.

At an operation 102, dielectric layer 68 is formed over layer 26 and over the outer surface of terminal 21a, and subsequently, an opening 30 is Patterned in layer 68. In some embodiments, layer 68 comprises carbon-doped $SiO_2$ having a dielectric constant (K) value between about 3.2 and 3.7, which may be produced using a plasma-enhanced CVD (PECVD), or other suitable, process. In other embodiments, layer 68 comprises a polymer layer, such as low temperature cure photosensitive Polyimide, having the K value between about 3.2 and 3.7, which is produced by Asahi Kasei Corporation (Tokyo, Japan) using a spinning process. Opening 30 is patterned in layer 68 using any suitable photolithography and etching techniques.

At an operation 104, a metal seed layer 32, typically made from titanium and copper formed using a sputtering or other suitable process, is formed over the outer surface of layer 68 and over the outer surface of terminal 21a. Note that seed layer 32 is intended to be used as an electrode for depositing one or more copper layers using an electroplating process, as will be described in subsequent process operations of the method.

At an operation 106, a photoresist 34 is patterned over the outer surface of seed layer 32 using any suitable photolithography process. Note that the areas not covered by photoresist 34 are electrically conductive, and the one or more exposed sections of layer are intended to be used as electrodes in the electroplating process.

At an operation 108, via 60 and trace 61 (made from copper) are formed using an electroplating or other suitable process. Note that sections of seed layer 32 that are coated with photoresist 34 will not be coated by the copper layer in the electroplating process.

At an operation 110, a stack comprising photoresist 34 and seed layer 32 is removed from the surface of layer 68 (using any suitable type or resist removal processes), and the formation of via 60 and trace 61 has been completed.

At an operation 112, dielectric layer 69a is formed over the outer surface of trace 61 and dielectric layer 68.

In some embodiments, in case layer 69a comprises the porous $CH_3$-doped $SiO_2$ layer described in FIG. above, operation 112 comprises an ultraviolet (UV) curing process. In alternative embodiments, in case layer 69a comprises dielectric polymer, the deposition process may comprise dispensing and spinning of any suitable type of polymer, such as photosensitive polyimide (PI) or Polybenzoxazoles (PBO)), or any other suitable deposition process of layer 69a.

In some embodiments, operations 102-112 are repeated for producing: (i) via 62 and trace 63, and subsequently, (ii) via 64 and trace 65, which are all shown in FIG. 2 above. Note that at least one of layers 69a and 69b may have a different structure and/or may comprise different materials than that of layer 68 (e.g., carbon-doped $SiO_2$ and $CH_3$-doped $SiO_2$), thus, at least one of layers 69a and 69b may be produced using a different process than that used for producing layer 68.

In other embodiments, the formation of the vies and traces of SR 66 and ECs 77 may be carried out using any other suitable processes.

The operations of the method of FIG. 5 are provided by way of example, in order to illustrate certain problems that are addressed by embodiments of the present disclosure and to demonstrate the application of these embodiments in enhancing the performance of such an electronic device. Embodiments of the present disclosure, however, are by no means limited to this specific sort of fabrication technique, and the principles described herein may similarly be applied to other sorts of methods and operations used for producing electronic devices, such as electronic device 11.

Figure 6:
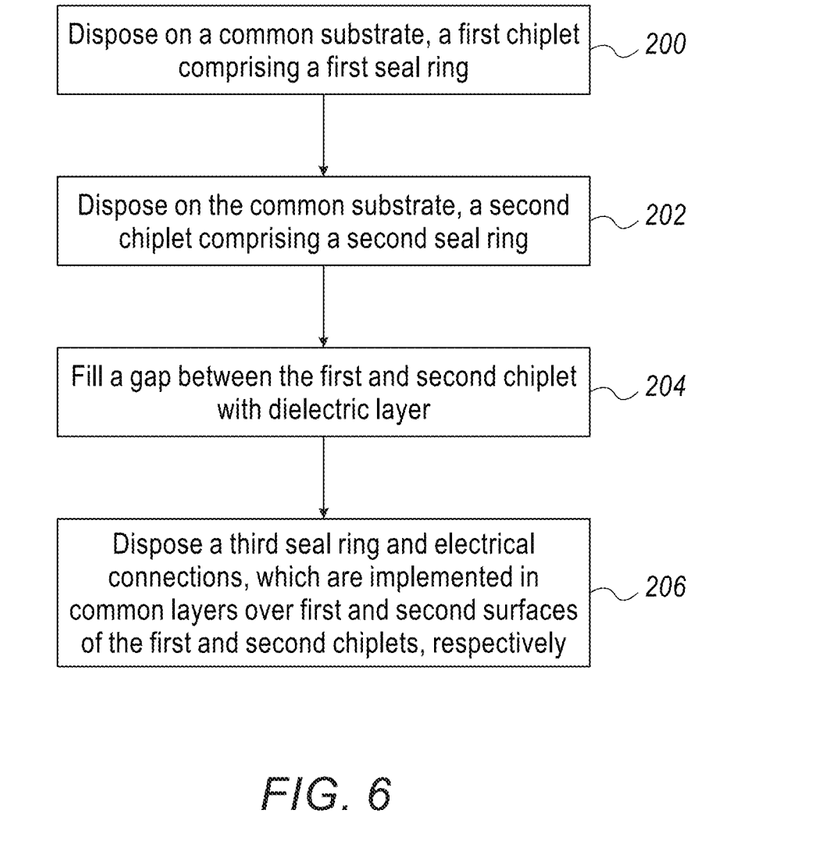
FIG. 6 is a flow chart that schematically illustrates a method for producing the electronic device of FIGS. 1 and 2, in accordance with an embodiment that is described herein.

FIG. 6 is a flow chart that schematically illustrates a method for producing electronic device 11 of FIGS. 1 and 2, in accordance with an embodiment that is described herein. The method begins at a first chiplet disposing operation 200 with disposing, on a suitable substrate (e.g., a temporary carrier substrate), chiplet 22 having seal ring 44 that is disposed between surface 20a and substrate 18a of chiplet 22.

At a second chiplet disposing operation 202, chiplet 33, which has seal ring 55 disposed between surface 20b and substrate 18b of chiplet 33, is disposed on the carrier substrate adjacent to chiplet 22.

At a gap filling operation 204, gap 51 between chiplets 22 and 33 is filled with dielectric layer 67 having a dielectric constant (K) between 3.4 and 3.7, as shown and described in inset 49 of FIG. 2 above.

At a seal ring and electrical connections formation operation 206 that concludes the method, seal ring 66 and ECs 77 of stack 99 are formed on surfaces 20a and 20b and on the outer surface of dielectric layer 67. In some embodiments, seal ring 66 and ECs 77 are implemented in common layers of stack 99, such as in vias 60, 62 and 64, and in traces 61, 63 and 65, as shown and described in FIG. 2 above.

In some embodiments, the layers of stack 99 are formed using: (i) several types of layer deposition processes (e.g., PECVD, electroplating, sputtering, and dispensing and spinning), (ii) one or more types of photolithography processes, and processes of selective removal of one or more patterned layers, e.g., etching of openings 28 and 30, and removal of photoresist layer 34 and seed layer 32), as described in detail in FIG. 5 above.

In some embodiments, the deposition of at least two of dielectric layers 67, 68, 69a and 69b, may be carried using different processes in order to obtain different dielectric constants, respectively. For example, layer 67 may comprise carbon-doped silicon dioxide (SiO2) having a dielectric constant (K) value between about 3.2 and 3.7, which is formed using a PECVD process, and layer 68 may comprise a dielectric polymer later, such as the aforementioned low temperature cure photosensitive Polyimide, which is produced by Asahi Kasei Corporation using a spinning process or other suitable process.

In some embodiments, chiplets 22 and 33 are connected to interposer 42 by forming bumps 45 therebetween, and interposer 42 is connected to CB 43 by forming balls 46 therebetween, as shown and described in FIG. 2 above.

In other embodiments, instead of interposer 42 and bumps 45, chiplets 22 and 33 are formed on a carrier (not shown), which is removed after the formation of SR 66 and ECs 77, and suitable bumps or balls are formed on one or both of surfaces 53 and 57 for electrically connecting between electronic device 11 and CB 43 or any other suitable substrate.

In some embodiments, after concluding the formation of stack 99 over chiplets 22 and 33, the carrier substrate is removed and the combination of chiplets 22 and 33 and stack 99 is flipped as shown in the sectional view of FIG. 2 above. Subsequently, stack 99 is connected to bumps 45, so as to form electronic assembly 10 shown in FIGS. 1 and 2 above.

In other embodiments, the combination of stack 99 over chiplets 22 and 33 may be mounted directly (e.g., without being flipped) over a substrate (e.g., interposer 42 or a suitable printed circuit board (also referred to herein as an IC substrate) and TSVs (not shown) are formed in chiplets 22 and 33 for connecting between the active devices of chiplets 22 and 33 and the substrate on which they are mounted on.

The operations of the method of FIG. 6 are simplified for the sake of conceptual clarity and are provided by way of example, in order to illustrate certain problems that are addressed by embodiments of the present disclosure and to demonstrate the application of these embodiments in enhancing the performance of such an electronic device. Embodiments of the present disclosure, however, are by no means limited to this specific sort of fabrication technique, and the principles described herein may similarly be applied to other sorts of methods and operations used for producing seal rings and/or electrical connections implemented in any other suitable types of electronic devices. Moreover, the method of FIG. 6 may comprise additional operations, such as but not limited to surface preparation. (e.g., before deposition of layers) and cleaning of residues, which are removed from the description but are carried out as part of the fabrication process of the components disclosed, e.g., in FIGS. 1 and 2 above.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic device, comprising:
    a first chiplet comprising a first seal ring, which is disposed in metal layers embedded between a first surface of the first chiplet, and a first substrate of the first chiplet;
    a second chiplet comprising a second seal ring, which is disposed in metal layers embedded between a second surface of the second chiplet, and a second substrate of the second chiplet, the first and second chiplet being positioned side-by-side on a dielectric substrate;

a third seal ring, which surrounds the first and second chiplets and is disposed in the dielectric substrate extrinsic to the metal layers and overlaying the first and second surfaces of the first and second chiplets; and electrical connections disposed outside the first chiplet and the second chiplet, the electrical connections configured to electrically couple the first and second chiplets and to conduct electrical signals between the first and second chiplets.

2. The electronic device according to claim 1, wherein at least a third section of the third seal ring is disposed over first and second sections of the first and second seal rings, respectively.

3. The electronic device according to claim 1, wherein the first chiplet comprises first electrical terminals disposed on the first surface, the second chiplet comprises second electrical terminals disposed on the second surface, wherein the electrical connections are (i) disposed over the first and second electrical terminals and overlaying at least a section of at least one of the first and second substrates, and (ii) configured to conduct electrical signals between the first and second electrical terminals.

4. The electronic device according to claim 3, wherein the electronic device comprises at least an electrically-conductive layer and wherein at least a section of the third seal ring and the electrical connections is implemented in the electrically-conductive layer.

5. The electronic device according to claim 4, wherein the electrical connections are formed in at least first and second layers of a stack of layers that are electrically connected using one or more conductive vias, the stack of layers comprising (a) a first dielectric layer, which is formed between: (i) the first and second surfaces, and (ii) the first layer, and having a first dielectric constant, and (b) a second dielectric layer, which is formed between the first and second layers, and having a second dielectric constant, different from the first dielectric constant.

6. The electronic device according to claim 5, wherein the stack of layers comprises the third seal ring implemented in at least the first and second layers disposed over the first and second surfaces, wherein the first and second chiplets and the stack of layers are flipped and are disposed on a common substrate, wherein the electronic device comprises a gap between the first and second chiplets, wherein the gap is filled with a third dielectric layer having a third dielectric constant different from the second dielectric constant, and wherein a fourth section of the third seal ring is disposed on a surface of the first dielectric layer.

7. The electronic device according to claim 6, wherein at least one of the first and second dielectric constants is smaller than the third dielectric constant.

8. The electronic device according to claim 6, wherein the common substrate comprises an interposer or a circuit board, and additional comprising electrical connections, which are disposed between the common substrate and at least one of the first and second layers of the stack of layers, which are configured to conduct signals between the common substrate and at least one of the first and second layers.

9. The electronic device according to claim 5, wherein the first and second layers comprise copper, the first dielectric layer comprises carbon-doped silicon dioxide or photosensitive polyimide having the first dielectric constant larger than 3.2, and wherein the second dielectric layer comprises porous $CH_3$-doped silicon dioxide or polybenzoxazoles (PBO), wherein the second dielectric constant is smaller than 2.7.

10. The electronic device according to claim 1, wherein the third seal ring encloses an area larger than 858 square millimeters.

11. A method for producing an electronic device, the method comprising:

disposing, on a common substrate, a first chiplet comprising a first seal ring formed in metal layers of the first chiplet, the first seal ring being disposed between a first surface of the first chiplet, and a first substrate of the first chiplet;

disposing, on the common substrate adjacent to the first chiplet, a second chiplet comprising a second seal ring formed in metal layers of the second chiplet, the second seal ring being disposed between a second surface of the second chiplet, and a second substrate of the second chiplet;

disposing between the common substrate and the first and second chiplets, a dielectric substrate, extrinsic to the metal layers, to overlay the first and second surfaces of the first and second chiplets- and forming in the dielectric substrate a third seal ring to surround the first and second chiplets; and disposing outside the first chiplet and the second chiplet, electrical connections to electrically couple the first and second chiplets and to conduct electrical signals between the first and second chiplets.

12. The method according to claim 11, wherein disposing the third seal ring comprises disposing, at least a third section of the third seal ring, over first and second sections of the first and second seal rings, respectively.

13. The method according to claim 11, wherein the first chiplet comprises first electrical terminals disposed on the first surface, and the second chiplet comprises second electrical terminals disposed on the second surface, and wherein disposing the electrical connections comprises disposing the electrical connections over the first and second electrical terminals and overlaying at least a section of at least one of the first and second substrates for conducting electrical signals between the first and second electrical terminals.

14. The method according to claim 13, wherein disposing the third seal ring and the electrical connections comprises forming at least an electrically-conductive layer and wherein at least a section of the third seal ring and the electrical connections are implemented in the electrically-conductive layer.

15. The method according to claim 14, wherein disposing the electrical connections comprises forming a stack of layers comprising at least first and second layers and one or more conductive vias for electrically connecting between the first and second layers, and wherein forming the stack of layers comprising: (a) forming a first dielectric layer, between: (i) the first and second surfaces, and (ii) the first layer, the first dielectric layer having a first dielectric constant, and (b) forming a second dielectric layer between the first and second layers, the second dielectric layer having a second dielectric constant, different from the first dielectric constant.

16. The method according to claim 15, wherein forming the stack of layers comprises forming the third seal ring implemented in at least the first and second layers disposed over the first and second surfaces, and flipping the first and second chiplets and the stack of layers and disposing the stack of layers on the common substrate, wherein the electronic device comprises a gap between the first and second chiplets, and comprising filling the gap with a third dielectric layer having a third dielectric constant different from the second dielectric constant, and disposing a fourth section of the third seal ring on a surface of the first dielectric layer.

17. The method according to claim 16, wherein at least one of the first and second dielectric constants is smaller than the third dielectric constant.

18. The method according to claim 16, wherein the common substrate comprises an interposer or a circuit board, and comprising disposing, between the common substrate and at least one of the first and second layers of the stack of layers, additional electrical connections for conducting signals between the common substrate and at least one of the first and second layers.

19. The method according to claim 15, wherein the first and second layers comprise copper, the first dielectric layer comprises carbon-doped silicon dioxide or photosensitive polyimide having the first dielectric constant larger than 3.2, and wherein the second dielectric layer comprises porous CH3-doped silicon dioxide or polybenzoxazoles (PBO), wherein the second dielectric constant is smaller than 2.7.

20. The method according to claim 11, wherein the third seal ring encloses an area larger than 858 square millimeters.

* * * * *